US011302627B1

(12) United States Patent
Chen et al.

(10) Patent No.: US 11,302,627 B1
(45) Date of Patent: Apr. 12, 2022

(54) ON-CHIP CAPACITORS IN THREE-DIMENSIONAL SEMICONDUCTOR DEVICES AND METHODS FOR FORMING THE SAME

(71) Applicant: YANGTZE MEMORY TECHNOLOGIES CO., LTD., Wuhan (CN)

(72) Inventors: Liang Chen, Wuhan (CN); Wei Liu, Wuhan (CN); Lei Xue, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/076,624

(22) Filed: Oct. 21, 2020

Related U.S. Application Data

(63) Continuation of application No. PCT/CN2020/118022, filed on Sep. 27, 2020.

(51) Int. Cl.
| | |
|---|---|
| *H01L 23/522* | (2006.01) |
| *H01L 27/11556* | (2017.01) |
| *H01L 27/11582* | (2017.01) |
| *H01L 21/768* | (2006.01) |
| *H01L 23/528* | (2006.01) |

(52) U.S. Cl.
CPC .... *H01L 23/5223* (2013.01); *H01L 21/76816* (2013.01); *H01L 21/76877* (2013.01); *H01L 23/5226* (2013.01); *H01L 23/5283* (2013.01); *H01L 23/5286* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | |
|---|---|---|
| 8,951,859 B2 | 2/2015 | Higashitani et al. |
| 8,956,968 B2 | 2/2015 | Higashitani et al. |
| 10,170,248 B2 | 1/2019 | Kwong |

(Continued)

FOREIGN PATENT DOCUMENTS

| | | |
|---|---|---|
| CN | 103843137 A | 6/2014 |
| CN | 107431063 A | 12/2017 |

(Continued)

OTHER PUBLICATIONS

International Search Report issued in corresponding International Application No. PCT/CN2020/118022, dated Jun. 24, 2021, 6 pages.

*Primary Examiner* — Hsien Ming Lee
(74) *Attorney, Agent, or Firm* — Bayes PLLC

(57) ABSTRACT

Embodiments of three-dimensional (3D) semiconductor devices and methods for forming the same are disclosed. In an example, a 3D memory device includes a memory stack, an isolation structure, and a plurality of capacitor contacts. The memory stack includes vertically interleaved conductive layers and first dielectric layers. The isolation structure extends vertically through at least part of the memory stack to electrically separate the conductive layers into gate electrodes in a core array region and capacitor electrodes in a dummy staircase region. The plurality of capacitor contacts are in contact with at least two of the capacitor electrodes in the dummy staircase region, respectively.

20 Claims, 13 Drawing Sheets

(56) References Cited

U.S. PATENT DOCUMENTS

| | | | |
|---|---|---|---|
| 10,629,675 B1* | 4/2020 | Nishikawa | H01L 27/11519 |
| 2009/0230449 A1 | 9/2009 | Sakaguchi et al. | |
| 2016/0365351 A1* | 12/2016 | Nishikawa | H01L 27/1157 |
| 2018/0323199 A1 | 11/2018 | Roberts et al. | |
| 2020/0194448 A1* | 6/2020 | Kim | H01L 23/5226 |

FOREIGN PATENT DOCUMENTS

| | | |
|---|---|---|
| CN | 110520984 A | 11/2019 |
| TW | 201423913 A | 6/2014 |
| TW | 201836159 A | 10/2018 |

* cited by examiner

300 though not explicitly described, are within the scope of the disclosure. Additionally, the described embodiments need not have all the aspects or advantages shown. An aspect or an advantage described in conjunction with a particular embodiment is not necessarily limited to that embodiment and can be practiced in any other embodiments even if not so illustrated, or if not so explicitly described.

ON-CHIP CAPACITORS IN THREE-DIMENSIONAL SEMICONDUCTOR DEVICES AND METHODS FOR FORMING THE SAME

CROSS-REFERENCE TO RELATED APPLICATIONS

This application is continuation of International Application No. PCT/CN2020/118022, filed on Sep. 27, 2020, entitled "ON-CHIP CAPACITORS IN THREE-DIMENSIONAL SEMICONDUCTOR DEVICES AND METHODS FOR FORMING THE SAME," which is hereby incorporated by reference in its entirety.

BACKGROUND

Embodiments of the present disclosure relate to semiconductor devices and fabrication methods thereof.

Integrate circuits technology allows creating many types of devices on the silicon die. The most common devices are transistors, diodes, resistors, or capacitors. Capacitors are elements that are used in semiconductor devices for storing an electrical charge. Capacitors include two conductive plates separated by an insulating material. Capacitors are used in applications such as electronic filters, analog-to-digital converters, memory devices, control applications, and many other types of semiconductor device applications.

Various types of capacitor designs have been used in integrating on-chip capacitors to reduce the die-area occupied by the capacitors and increase the capacitance density, including, for example, metal-insulator-metal (MIM) capacitors, metal-oxide-metal (MOM) capacitors, metal-oxide-semiconductor (MOS) capacitors, metal fringe capacitors, trench capacitors, and junction capacitors, to name a few.

SUMMARY

Embodiments of three-dimensional (3D) semiconductor devices and methods for forming the same are disclosed herein.

In one example, a 3D memory device includes a memory stack, an isolation structure, and a plurality of capacitor contacts. The memory stack includes vertically interleaved conductive layers and first dielectric layers. The isolation structure extends vertically through at least part of the memory stack to electrically separate at least some of the conductive layers into gate electrodes in a core array region and capacitor electrodes in a dummy staircase region. The plurality of capacitor contacts are in contact with at least two of the capacitor electrodes in the dummy staircase region, respectively.

In another example, a 3D semiconductor device includes a stack of a plurality of pairs of interleaved conductive layers and dielectric layers, a pair of capacitor contacts, and a capacitor. Edges of the plurality of pairs of interleaved conductive layers and dielectric layers are staggered. The pair of capacitor contacts are in contact with two conductive layers of two pairs of the plurality of pairs of interleaved conductive layers and dielectric layers, respectively. The capacitor includes the two conductive layers and one or more dielectric layers vertically between the two conductive layers. The two conductive layers are electrically separated from one another.

In still another example, a method for forming a 3D memory device is disclosed. A memory stack including vertically interleaved conductive layers and first dielectric layers is formed above a substrate. An isolation structure extending vertically through at least part of the memory stack is formed to electrically separate at least some of the conductive layers into gate electrodes in a core array region and capacitor electrodes in a dummy staircase region. A plurality of capacitor contacts in contact with at least two of the capacitor electrodes in the dummy staircase region, respectively, are formed.

In yet another example, a method for operating a 3D semiconductor device is disclosed. The 3D semiconductor device includes a stack of a plurality of pairs of interleaved conductive layers and dielectric layers. Edges of the plurality of pairs of interleaved conductive layers and dielectric layers are staggered. A capacitor is charged by applying a voltage on a pair of capacitor contacts in contact with two conductive layers of two pairs of the plurality of pairs of interleaved conductive layers and dielectric layers, respectively. The capacitor includes the two conductive layers and one or more dielectric layers vertically between the two conductive layers. The two conductive layers are electrically separated from one another. The voltage is supplied by the capacitor.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
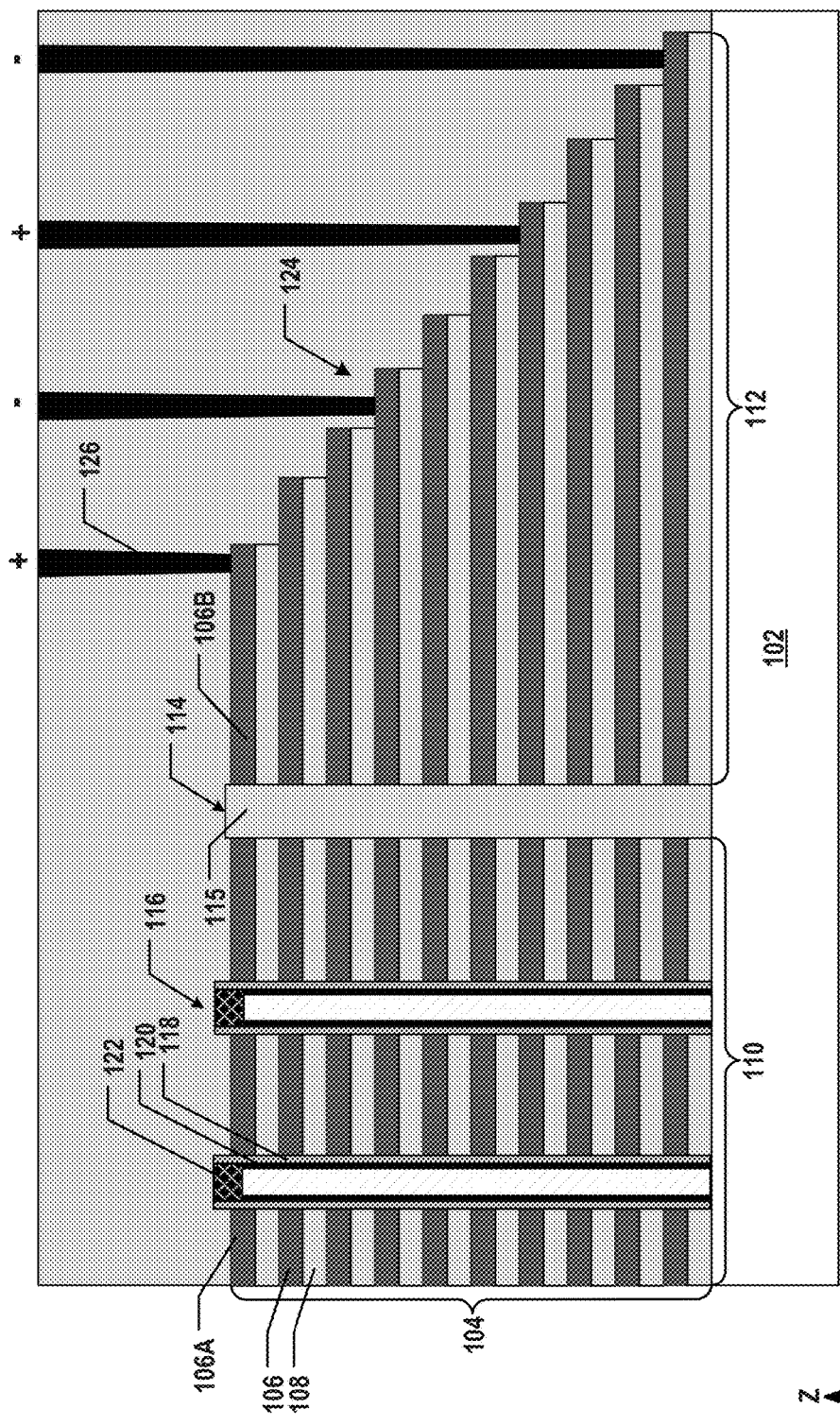
FIGS. 1A and 1B illustrate a side view of a cross-section of an exemplary 3D memory device having on-chip capacitors, according to various embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means "above" or "over" something but can also include the meaning that it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region, of a homogeneous or inhomogeneous continuous structure, that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter, for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some semiconductor devices, such as NAND Flash memory devices, on-chip capacitors are formed in the peripheral circuits. As capacitors are the bulkiest devices in the peripheral circuits, the conventional designs of on-chip capacitors limit the shrinkage of the die area of the perioral circuits as well as the flexibility of the metal routing. In particular, for some 3D semiconductor devices in which multiple chips are stacked, the large area of on-chip capacitors even on one chip can limit the shrinkage of the entire device size.

Various embodiments in accordance with the present disclosure provide various novel designs of on-chip capacitors in 3D semiconductor devices. By utilizing the existing dummy staircase regions in the 3D semiconductor devices, such as 3D memory devices, and electrically separating parts of word lines/gate lines in the dummy staircase regions from the rest of the word lines/gate lines, on-chip capacitors can be formed using the word lines/gate lines in the dummy staircase regions and the gate-to-gate dielectric layers between the word lines/gate lines. In some embodiments, the pair of word lines/gate lines used for forming the on-chip capacitor are spaced apart by at least another word line/gate line in between to reduce the chance of short circuit. In some embodiments in which the memory array devices and the peripheral circuits are formed in separate substrates, which are bonded together to form the 3D semiconductor device, at least some on-chip capacitors used in the peripheral circuits can be transferred to the substrate on which the memory array devices are formed. As a result, the capacitance density of the on-chip capacitors can be increased without increasing the planar die size, and the metal routing of the semiconductor devices can be simplified as well.

Figure 1B:
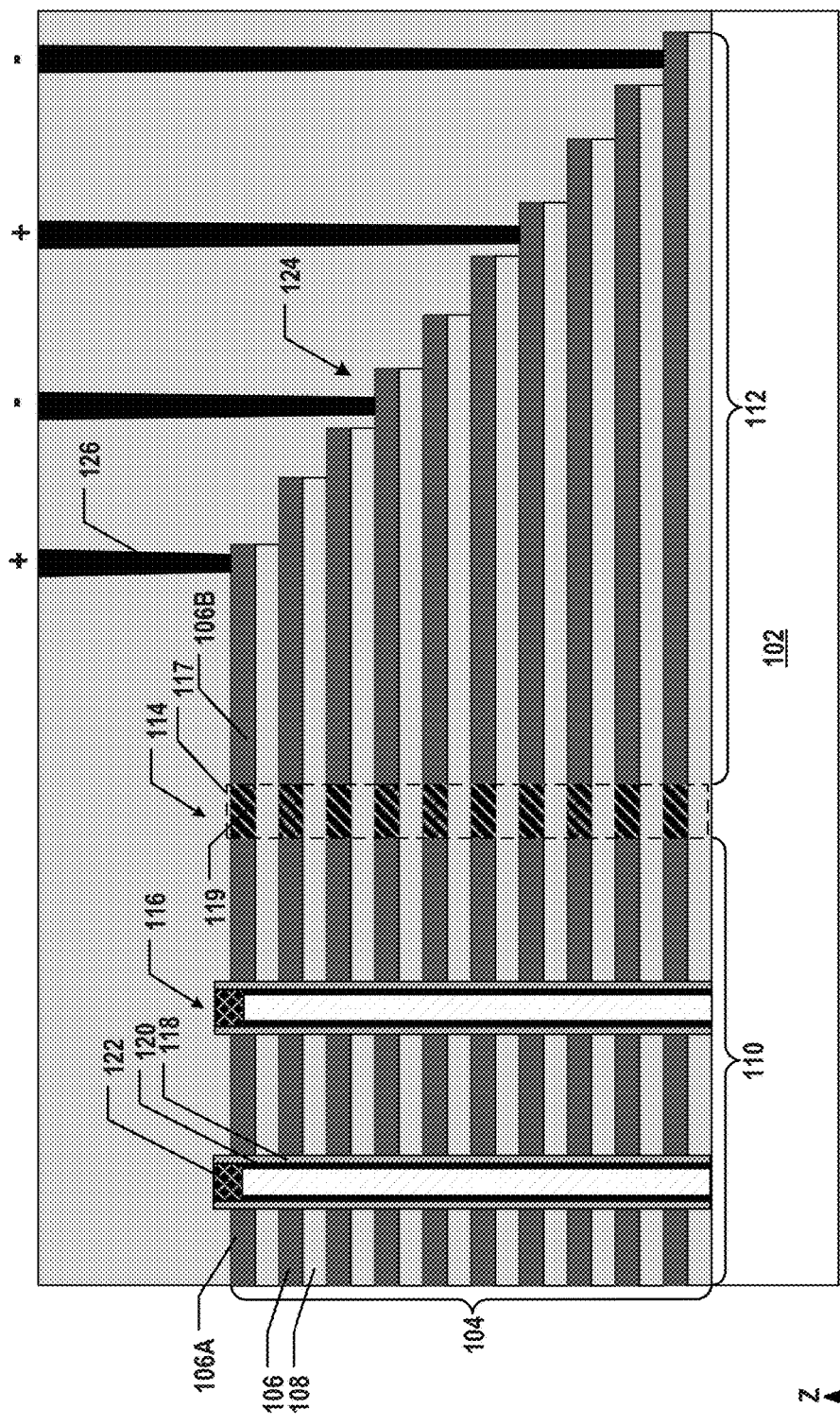

FIGS. 1A and 1B illustrate a side view of a cross-section of an exemplary 3D memory device 100 having on-chip capacitors, according to various embodiments of the present disclosure. 3D memory device 100 may be one example of a semiconductor device having on-chip capacitors disclosed herein. In some embodiments, 3D memory device 100 is a bonded chip including a memory array chip and a peripheral chip (not shown), according to some embodiments. As shown in FIGS. 1A and 1B, 3D memory device 100 can include a substrate 102, which can include silicon (e.g., single crystalline silicon, c-Si), silicon germanium (SiGe), gallium arsenide (GaAs), germanium (Ge), silicon on insulator (SOD, or any other suitable materials. It is noted that x-, y-, and z-axes are included in FIGS. 1A and 1B to illustrate the spatial relationships of the components in 3D memory device 100. Substrate 102 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-direction (the vertical direction perpendicular to the x-y plane) when the substrate is positioned in the lowest plane of the semiconductor device in the z-direction. The same notion for describing spatial relationships is applied throughout the present disclosure.

In some embodiments, the peripheral chip includes peripheral circuits (not shown) configured to control and sense the memory array devices on the memory array chip. The peripheral circuits can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). The peripheral circuits can include transistors, which are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments. It is understood that in some embodiments, the peripheral chip may further include any other circuits compatible with the advanced logic processes including logic circuits, such as processors and programmable logic devices (PLDs) or memory circuits, such as static random-access memory (SRAM). For example, the devices of the peripheral chip may be formed using complementary metal-oxide-semiconductor (CMOS) compatible processes and thus, may be referred to herein as a "CMOS chip."

In some embodiments, 3D memory device 100 is a NAND Flash memory device in which memory cells are provided in the form of an array of NAND memory strings on the memory array chip. As shown in FIGS. 1A and 1B, the memory array chip of 3D memory device 100 can include an array of channel structures 116 above substrate 102, functioning as the array of NAND memory strings. Each channel structure 116 can extend vertically through a plurality of pairs each including a conductive layer 106 and a dielectric layer 108. The interleaved conductive layers 106 and dielectric layers 108 are part of a memory stack 104. The number of the pairs of conductive layers 106 and dielectric layers 108 in memory stack 104 (e.g., 32, 64, 96, 128, 160, 192, 224, 256, or more) determines the number of memory cells in 3D memory device 100. It is understood that in some embodiments, memory stack 104 may have a multi-deck architecture (not shown), which includes a plurality of memory decks stacked over one another. The numbers of the pairs of conductive layers 106 and dielectric layers 108 in each memory deck can be the same or different. It is understood that a pad layer (not shown), such as an in-situ steam generation (ISSG) silicon oxide film, is formed between substrate 102 and memory stack 104, according to some embodiments.

Memory stack 104 can include a plurality of vertically interleaved conductive layers 106 and dielectric layers 108. Conductive layers 106 and dielectric layers 108 in memory stack 104 can alternate in the vertical direction. In other words, except the ones at the top or bottom of memory stack 104, each conductive layer 106 can be adjoined by two dielectric layers 108 on both sides, and each dielectric layer 108 can be adjoined by two conductive layers 106 on both sides. Conductive layers 106 can include conductive materials including, but not limited to, W, Co, Cu, Al, polysilicon, doped silicon, silicides, or any combination thereof. Each conductive layer 106 can include a gate line surrounded by an adhesive layer and a gate dielectric layer (not shown). The gate line of conductive layer 106 can extend laterally as a word line, ending at one or more staircase structures of memory stack 104. Dielectric layers 108 can include dielectric materials including, but not limited to, silicon oxide, silicon nitride, silicon oxynitride, or any combination thereof. Each dielectric layer 108 can function as the gate-to-gate dielectric layer vertically between and electrically separating adjacent conductive layers 106 (gate lines/word lines).

In some embodiments, conductive layers 106 include a metal, such as W, and dielectric layers 108 include silicon oxide. In some embodiments, each dielectric layer 108 has nominally the same thickness between about 15 nm and about 30 nm, such as between 15 nm and 30 nm (e.g., 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, any range bounded by the lower end by any of these values, or in any range defined by any two of these values). In some embodiments, each conductive layer 106 has nominally the same thickness between about 25 nm and about 40 nm, such as between 25 nm and 40 nm (e.g., 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, any range bounded by the lower end by any of these values, or in any range defined by any two of these values).

In some embodiments, each channel structure 116 includes a channel hole filled with a semiconductor layer (e.g., as a semiconductor channel 120) and a composite dielectric layer (e.g., as a memory film 118). In some embodiments, semiconductor channel 120 includes silicon, such as amorphous silicon, polysilicon, or single crystalline silicon. In some embodiments, memory film 118 is a composite layer including a tunneling layer, a storage layer (also known as a "charge trap layer"), and a blocking layer. The remaining space of channel structure 116 can be partially or fully filled with a capping layer including dielectric materials, such as silicon oxide, and/or an air gap. Channel structure 116 can have a cylinder shape (e.g., a pillar shape). The capping layer, semiconductor channel 120, the tunneling layer, storage layer, and blocking layer of memory film 118 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 118 can include a composite layer of silicon oxide/silicon oxynitride/silicon oxide (ONO).

In some embodiments, channel structure 116 further includes a channel plug 122 in the top portion (e.g., at the upper end) of channel structure 116. As used herein, the "upper end" of a component (e.g., channel structure 116) is the end farther away from substrate 102 in the z-direction, and the "lower end" of the component (e.g., channel structure 116) is the end closer to substrate 102 in the z-direction when substrate 102 is positioned in the lowest plane of 3D memory device 100. Channel plug 122 can include semiconductor materials (e.g., polysilicon). In some embodiments, channel plug 122 functions as the drain of the NAND memory string.

As shown in FIGS. 1A and 1B, memory stack 104 can include a core array region 110 and a dummy staircase region 112. In some embodiments, core array region 110 is the region of memory stack 104 in which channel structures 116 are formed. That is, each channel structure 116 extends vertically through memory stack 104 in core array region 110, according to some embodiments. Memory stack 104 can include one or more staircase structures 124 in dummy staircase region 112 in which the edges of the pairs of interleaved conductive layers 106 and dielectric layers 108 are staggered, as shown in FIGS. 1A and 1B. In some embodiments, corresponding edges of the pairs of interleaved conductive layers 106 and dielectric layers 108 along the vertical direction away from substrate 102 (the positive z-direction) can be staggered laterally towards channel structures 116 in core array region 110. In other words, the length of the pairs of interleaved conductive layers 106 and dielectric layers 108 of memory stack 104 decreases from bottom to top.

In some embodiments, the top layer in each level of staircase structure 124 (e.g., each pair of conductive layer 106 and dielectric layer 108 in FIGS. 1A and 1B) is conductive layer 106 for interconnection in the vertical directions. In some embodiments, every two adjacent levels of staircase structure 124 are offset by a nominally same distance in the vertical direction and a nominally same distance in the lateral direction. Each offset thus can form a "landing area" for interconnection with the word lines of 3D memory device 100 in the vertical direction. The offset of the edges of each adjacent pair of conductive layer 106 and dielectric layer 108 in staircase structure 124 is nominally the same, according to some embodiments.

As shown in FIGS. 1A and 1B, the memory array chip of 3D memory device 100 can further include isolation structures 114 each extending vertically through interleaved conductive layers 106 and dielectric layers 108 of memory stack 104 to electrically separate conductive layers 106 into gate electrodes 106A (gate lines/word lines) in core array region 110 and capacitor electrodes 106B in dummy staircase region 112. That is, each conductive layer 106 can be divided into two parts that are electrically separated from one another: gate electrodes 106A in core array region 110 functioning as the gate electrodes and word lines of memory cells, and capacitor electrodes 106B in dummy staircase region 112 as parts of the on-chip capacitors described below in detail. In some embodiments as shown in FIG. 1A, each isolation structure 114 includes a dielectric spacer 115 extending vertically through memory stack 104 to cut conductive layers 106 into gate electrodes 106A and capacitor electrodes 106B. Dielectric spacer 115 can include dielectric materials, including, but not limited to, silicon oxide, silicon nitride, silicon oxynitride, high dielectric constant (high-k) dielectrics, or any combination thereof. It is understood that in some examples, isolation structure 114 may further include a conductor (not shown) surrounded by dielectric spacer 115, for example, functioning as the source contact of the NAND memory strings. It is understood that in some examples, isolation structure 114 may not extend vertically through the entire thickness of memory stack 104 to cut all conductive layers 106 into gate electrodes 106A and capacitor electrodes 106B, but instead, may extend vertically through part of memory stack 104 to cut one or some of conductive layers 106 into gate electrodes 106A and capacitor electrodes 106B.

In some embodiments as shown in FIG. 1B, each isolation structure 114 includes a dielectric stack 117 including vertically interleaved dielectric layers 108 and another set of dielectric layers 119. That is, dielectric stack 117 can include parts of dielectric layers 108 of memory stack 104 as well as dielectric layers 119 having different dielectric materials, which are alternatingly formed in the vertical direction. In some embodiments, dielectric layers 108 include silicon oxide, and dielectric layers 119 include silicon nitride. As described below in detail, dielectric stack 117 of isolation structure 114 may be the remainder of a larger dielectric stack that is replaced by memory stack 104. Nevertheless, as dielectric stack 117 of isolation structure 114 shown in FIG. 1B also includes dielectric structures extending vertically through memory stack 104, dielectric stack 117 can cut conductive layers 106 of memory stack 104 into gate electrodes 106A and capacitor electrodes 106B as well, like dielectric spacer 115 of isolation structure 114 in FIG. 1A. It is understood that in some examples, dielectric stack 117 of isolation structure 114 may not extend vertically through the entire thickness of memory stack 104, but instead, may extend vertically through part of memory stack 104.

Figure 3:
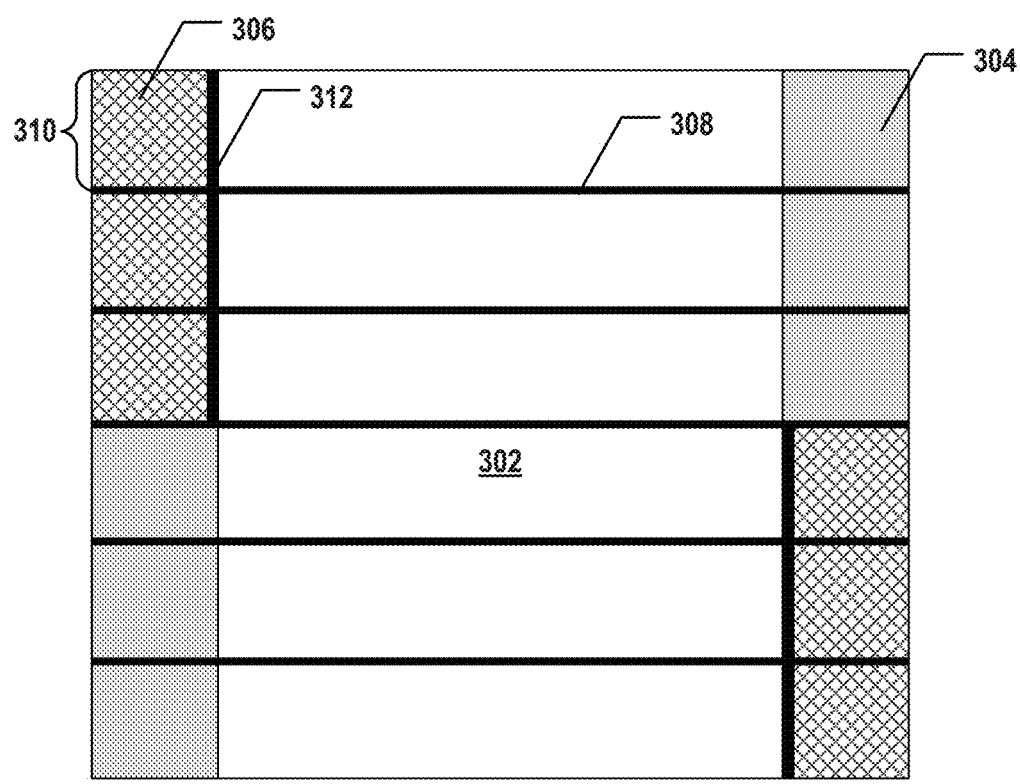
FIG. 3 illustrates a plan view of an exemplary 3D memory device having on-chip capacitors, according to some embodiments of the present disclosure.

Isolation structure 114 can extend laterally between core array region 110 and dummy staircase region 112 of memory stack 104, i.e., becoming the boundary between core array region 110 and dummy staircase region 112 in the plan view. For example, FIG. 3 illustrates a plan view of an exemplary 3D memory device 300 having on-chip capacitors, according to some embodiments of the present disclosure. 3D memory device 300 may be one example of 3D memory device 100 in FIGS. 1A and 1B. As shown in FIG. 3, 3D memory device 300 includes a core array region 302 in the intermediate (e.g., the center) of the memory stack, and staircase regions 304 and 306 at both sides of the memory stack in the x-direction (e.g., the word line direction). A staircase structure can be either a functional staircase structure in functional staircase region 304 used for landing interconnects (e.g., word line contacts) or a dummy staircase structure in dummy staircase region 306 used for balancing load during the fabrication processes. In some embodiments, dummy staircase region 306 and functional staircase region 304 are disposed at the same side of the memory stack, as shown in FIG. 3. Dummy staircase region 306 may be one example of dummy staircase region 112, and core array region 302 may be one example of core array region 110 in FIGS. 1A and 1B. As shown in FIG. 3, an isolation structure 312 (e.g., one example of isolation structure 114 in FIG. 1A) can extend laterally in the y-direction (e.g., the bit line direction) between dummy staircase region 306 and core array region 302 to separate dummy staircase region 306 and core array region 302.

In some embodiments, 3D memory device 300 further includes a plurality of parallel slit structures 308 (e.g., gate line slits (GLSs)) each extending vertically in the x-direction (e.g., the word line direction) to separate the memory stack into blocks 310. That is, slit structure 308 is perpendicular to isolation structure 312 and extends across core array region 302, functional staircase region 304, and dummy staircase region 306, according to some embodiments. In some embodiments, at least one slit structure 308 extends laterally in the x-direction between adjacent functional staircase region 304 and dummy staircase region 306 at the same side of the memory stack to separate functional staircase region 304 and dummy staircase region 306. As a result, the conductive layers (e.g., conductive layers 106 in FIG. 1A) in the memory stack are also electrically separated between adjacent functional staircase region 304 and dummy staircase region 306 by slit structure 308. That is, isolation structure 312 and slit structure 308 can insulate the capacitor electrodes (e.g., capacitor electrodes 106B in FIG. 1A) in dummy staircase region 306 from the conductive layers in core array region 302 and functional staircase region 304, respectively. In some embodiments, slit structures 308 also separate each dummy staircase region 306 into a plurality of blocks insulated from one another, as shown in FIG. 3. In some embodiments, isolation structure 312 and slit structure 308 include the same structure and materials, for example, a dielectric spacer (e.g., dielectric spacer 115 in FIG. 1A) as isolation structure 312 and slit structure 308 may be formed in the same fabrication process, as described below in detail.

Figure 4A:
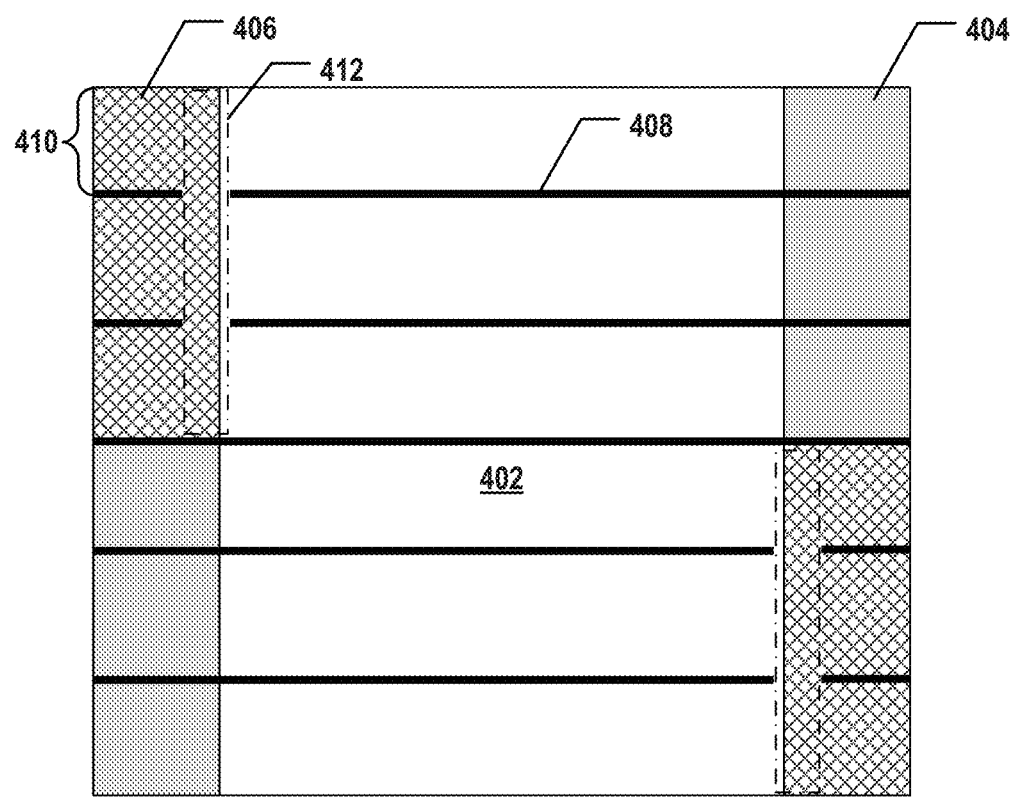
FIGS. 4A and 4B illustrate a plan view of another exemplary 3D memory device having on-chip capacitors, according to some embodiments of the present disclosure.
Figure 4B:
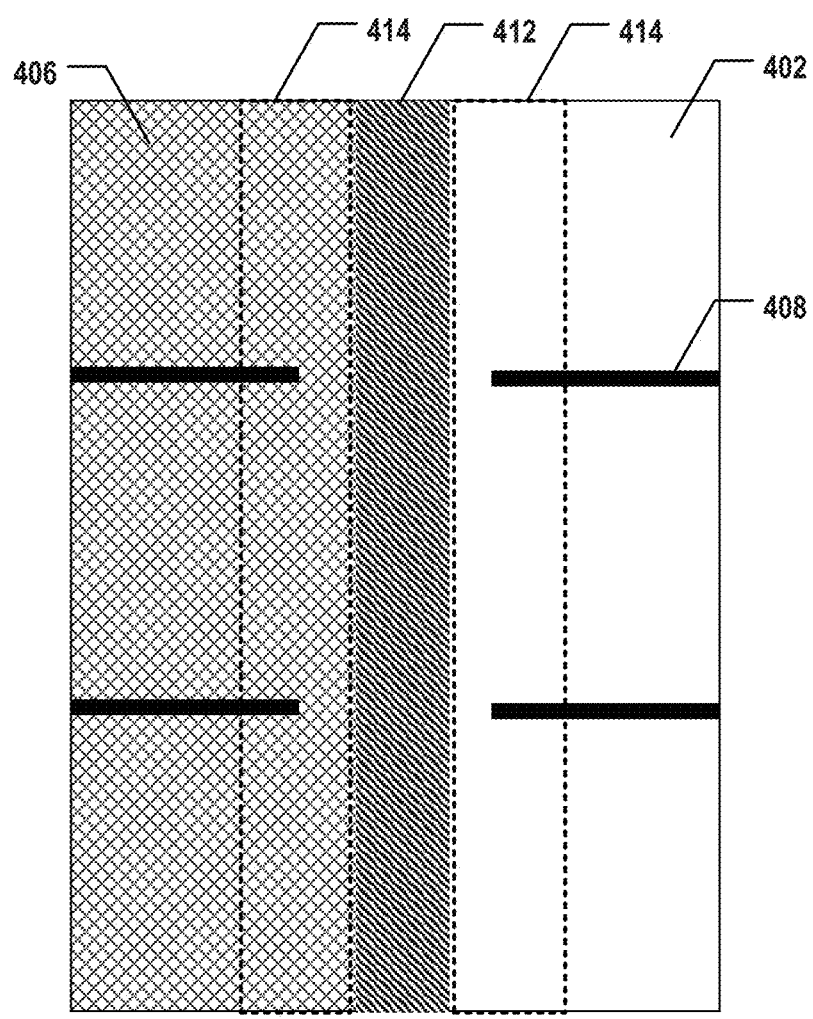

As described above with respect to FIG. 1B, an isolation structure may include a dielectric stack. For example, FIGS. 4A and 4B illustrate a plan view of another exemplary 3D memory device 400 having on-chip capacitors, according to some embodiments of the present disclosure. As shown in FIG. 4A, 3D memory device 400 includes a core array region 402 in the intermediate (e.g., the center) of the memory stack, and staircase regions 404 and 406 at both sides of the memory stack in the x-direction (e.g., the word line direction). A staircase structure can be either a functional staircase structure in functional staircase region 404 used for landing interconnects (e.g., word line contacts) or a dummy staircase structure in dummy staircase region 406 used for balancing load during the fabrication processes. In some embodiments, dummy staircase region 406 and functional staircase region 404 are disposed at the same side of the memory stack, as shown in FIG. 4A. Dummy staircase region 406 may be one example of dummy staircase region 112, and core array region 402 may be one example of core array region 110 in FIGS. 1A and 1B.

In some embodiments, 3D memory device 400 further includes a plurality of parallel slit structures 408 (e.g., GLSs) each extending vertically in the x-direction (e.g., the word line direction) to separate the memory stack into memory blocks 410. In some embodiments, at least one slit structure 408 extends laterally in the x-direction between adjacent functional staircase region 404 and dummy staircase region 406 at the same side of the memory stack to separate functional staircase region 404 and dummy staircase region 406. Different from slit structure 308 in FIG. 3, which is a continuous structure extending across core array region 302, functional staircase region 304, and dummy staircase region 306, slit structure 408 in FIG. 4A extends across core array region 402 and functional staircase region 404, but is cut off by an isolation structure 412 between dummy staircase region 406 and core array region 402, according to some embodiments.

As shown in FIG. 4A, isolation structure 412 (e.g., one example of isolation structure 114 in FIG. 1B) can extend laterally in the y-direction (e.g., the bit line direction) between dummy staircase region 406 and core array region 402 to separate dummy staircase region 406 and core array region 402. As shown in the enlarged view of FIG. 4B, isolation structure 412 is spaced apart from slit structures 408 in the x-direction, according to some embodiments. As described above with respect to isolation structure 114 in FIG. 1B, isolation structure 412 can include a dielectric stack having vertically interleaved two dielectric layers, which is the remainder of a larger dielectric stack that is replaced by the memory stack after a gate-replaced process. As slit structures 408 are used as the passageways of the gate-replacement process where the dielectric stack starts to be replaced by the memory stack, by cutting off slit structures 408 and controlling the distance of the cuts and the time of the gate-replacement process, the gate-replacement process at the ends of slit structures 408 only affects regions 414, leaving the remainder of the dielectric stack to remain intact after the gate-replacement process to become isolation structure 412, as described below in detail with respect to the fabrication process. As a result, different from 3D memory device 300 in which isolation structure 312 and slit structure 308 include the same structure and materials, for example, a dielectric spacer (e.g., dielectric spacer 115 in FIG. 1A), isolation structure 412 and silt structures 408 of 3D memory device 400 may include different structures and different materials. In some embodiments, slit structures 408 in combination with isolation structure 412 also separate each dummy staircase region 406 into a plurality of blocks insulated from one another, as shown in FIG. 4A.

Figure 5:
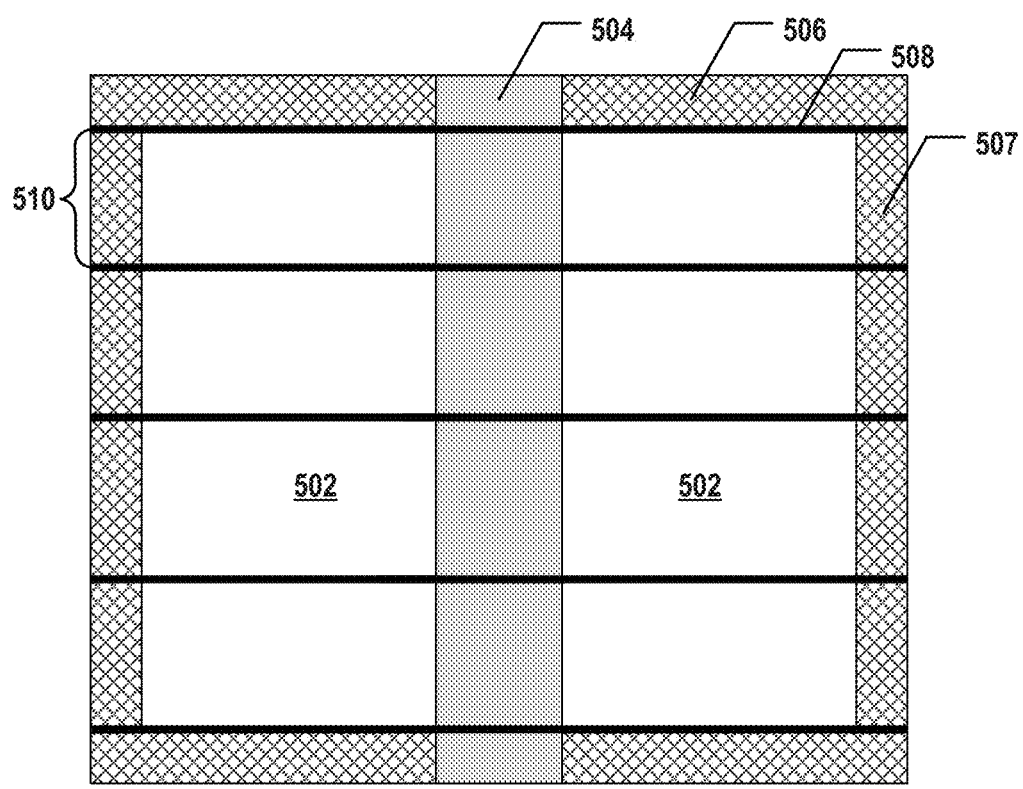
FIG. 5 illustrates a plan view of still another exemplary 3D memory device having on-chip capacitors, according to some embodiments of the present disclosure.
Figure 5:
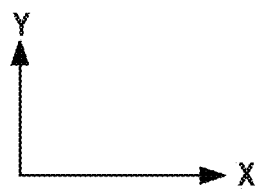

It is understood that the positions of the functional staircase regions and dummy staircase regions in the memory stack are not limited by the examples of FIGS. 3, 4A, and 4B (e.g., at the sides of the memory stack in the word line direction). For example, the functional staircase region may be disposed in the intermediate (e.g., the center) of the memory stack in the word line direction, and the dummy staircase regions may be disposed at the sides of the memory stack in the bit line direction. For example, FIG. 5 illustrates a plan view of still another exemplary 3D memory device 500 having on-chip capacitors, according to some embodiments of the present disclosure. As shown in FIG. 5, 3D memory device 500 includes a functional staircase region 504 in the intermediate (e.g., the center) of the memory stack in the x-direction (e.g., the word line direction) to separate a core array region 502 into two parts, and dummy staircase regions 506 and 507 at both sides of the memory stack in the x-direction and y-direction (e.g., the bit line direction), respectively.

In some embodiments, 3D memory device 500 further includes a plurality of parallel slit structures 508 (e.g., GLSs) each extending vertically in the x-direction (e.g., the word line direction) to separate the memory stack into memory blocks 510. In some embodiments, at least one slit structure 508 extends laterally in the x-direction between dummy staircase region 506 at each side of the memory stack in the y-direction and core array region 502 to separate dummy staircase region 506 and core array region 502 in the y-direction. Different from 3D memory devices 300 and 400 in FIGS. 3, 4A, and 4B in which an isolation structure 312 or 412 that is different from slit structure 308 or 408, at least one slit structure 508 also functions as the isolation structure (e.g., one example of isolation structure 114 in FIG. 1A) that separates dummy staircase region 506 and core array region 502. That is, there is no dedicated isolation structure that may be needed in 3D memory device 500. If one of slit structures 508 that separates core array region 502 and dummy staircase region 506 is viewed as the isolation structure, other slit structures 508 extend laterally and parallel to the isolation structure to extend across functional staircase region 504. In some embodiments, at each side of the memory stack in the y-direction, each dummy staircase region 506 can be separated by functional staircase region 504 into two blocks insulated from one another, as shown in FIG. 5.

As shown in FIG. 5, 3D memory device 500 also includes dummy staircase region 507 at each side of the memory stack in the x-direction, according to some embodiments. Since slit structure 508 extends laterally in the x-direction as well, slit structure 508 cannot separate core array region 502 and dummy staircase region 507 at each side of the memory stack in the x-direction. Thus, dummy staircase region 507 may not be used for forming on-chip capacitors, which is different from dummy staircase region 506. It is understood that in some examples, an additional, dedicated isolation structure extending laterally in the y-direction, like isolation structure 312 in FIG. 3, may be included in 3D memory device 500 to separate core array region 502 and dummy staircase region 507, such that dummy staircase region 507 may be used for forming on-chip capacitors as well. As described below in detail, since dummy staircase regions 306, 406, and 506 do not provide any electric functions in 3D memory devices 300, 400, and 500, respectively, and are electrically separated from core array regions 302, 402, and 502 and functional staircase regions 304, 404, and 504, dummy staircase regions 306, 406, and 506 may be utilized for forming on-chip capacitors as described below in detail, which do not require extra space from the memory array chips of 3D memory devices 300, 400, and 500. The metal routing of 3D memory devices 300, 400, and 500 can be simplified as well due to the floorplan of the on-chip capacitors in dummy staircase regions 306, 406, and 506 outside of core array regions 302, 402, and 502.

Referring back to FIGS. 1A and 1B, 3D memory device 100 also includes a plurality of capacitor contacts 126 in contact with at least two capacitor electrodes 106B in dummy staircase region 112, respectively. That is, 3D memory device 100 can include one or more pairs of capacitor contacts 126, and each pair of capacitor contacts 126 can be above and in contact with a pair of capacitor electrodes 106B. Each capacitor contact 126 can be a vertical interconnect access (VIA) contact landing on the landing area of conductive layer 106 of a pair of conductive layer 106 and dielectric layer 108. Capacitor contacts 126 can include one or more conductive layers, such as a metal layer (e.g., W, Co, Cu, or Al). Although not shown in FIG. 1A, it is understood that 3D memory device 100 may also include word line contacts above and in contact with conductive layers 106 in the functional staircase region for word line fan-out, which may have the same structures and materials as capacitor contacts 126, may be formed in the same process in forming the word line contacts as described below in detail.

In some embodiments, a pair of capacitor contacts 126 (labeled with "+" and "−" in FIGS. 1A and 1B) includes a first capacitor contact 126 "+" and a second capacitor contact 126 "−" in contact with a first capacitor electrode 106B and a second capacitor electrode 106B, respectively. First and second capacitor electrodes 106B and one or more dielectric layers 108 vertically between first and second capacitor electrodes 106B in dummy staircase region 112 are configured to form a capacitor, according to some embodiments. The pair of first and second capacitor electrodes 106B thus can act as two electrodes of the capacitor separated by a capacitor dielectric, i.e., parts of dielectric layers 108 vertically between the pair of first and second capacitor electrodes 106B. In some embodiments, first and second capacitor electrodes 106B are electrically separated from one another. Although not shown in FIGS. 1A and 1B, it is understood that in some examples, dummy channel structures may be formed extending vertically through memory stack 104 in dummy staircase region 112 as well to balance the etch load of channel holes and provide supports for staircase structures 124. Each dummy channel structure may be filled with dielectric materials, such as silicon oxide, but not conductive materials, to avoid electrically connecting different capacitor electrodes 106B in dummy staircase region 112 and to ensure that first and second capacitor electrodes 106B are electrically separated from one another.

In some embodiments, first and second capacitor electrodes 106B in contact with first and second capacitor contacts 126 "+" and "−" are spaced apart by at least one another capacitor electrode 106B vertically between first and second capacitor electrodes 106B to reduce the risk that first and second capacitor electrodes 106B are electrically connected, i.e., forming a short circuit, for various reasons, such as first capacitor contact 126 "+" penetrating through first capacitor electrode 106B and dielectric layer 108 underneath (e.g., due to over etch) to contact second capacitor electrode 106B, or first or second capacitor electrode 106B extending through dielectric layer 108 therebetween to contact one another (e.g., due to insufficient recess etch in the gate-replacement process). By using first and second capacitor electrodes 106B that are not adjacent to one another (i.e., spacing apart by at least one another capacitor electrode 106B in-between), the change of short circuit between first and second capacitor electrodes 106B can be significantly reduced. In some embodiments, the at least one another capacitor electrode 106B vertically between includes two capacitor electrodes 106B. That is, first and second capacitor electrodes 106B are spaced apart by two capacitor electrodes 106B in two levels of staircase structure 124 to further reduce the chance of short circuit, as shown in FIGS. 1A and 1B. It is understood that the number of levels of staircase structures 124 and the capacitor electrodes 106B therein between first and second capacitor electrodes 106B are not limited by the example of FIGS. 1A and 1B. In one example, first and second capacitor electrodes 106B may be spaced apart by three or more capacitor electrodes 106B in-between. In another example, first and second capacitor electrodes 106B may be adjacent to one another, i.e., in adjacent levels of staircase structure 124 without any capacitor electrodes 106B in-between.

By forming on-chip capacitors in dummy staircase region 112 in the memory array chip, some or all of the capacitors used by the peripheral chip/CMOS chip of 3D memory device 100 can be transferred from the peripheral chip/CMOS chip to the memory array chip. In some embodiments, the peripheral chip/CMOS chip of 3D memory device 100 does not have an on-chip capacitor therein to reduce the die size of the peripheral chip/CMOS chip. Instead, the memory array chip of 3D memory device 100 can have a plurality of capacitors formed in dummy staircase region 112 and electrically connected to the peripheral circuits of the peripheral chip/CMOS chip through the interconnects between the two chips to satisfy the needs of capacitors the peripheral chip/CMOS chip.

It is understood although the on-chip capacitors are illustrated in 3D memory device 100 in FIGS. 1A and 1B, the on-chip capacitors disclosed herein may be formed in any other suitable semiconductor devices, such as any 3D semiconductor devices having a stack of a plurality of pairs of interleaved conductive layers and dielectric layers, and the edges of the plurality of pairs of interleaved conductive layers and dielectric layers are staggered, i.e., having a dummy staircase structure. It is also understood that a 3D memory device having on-chip capacitors disclosed herein is not limited to the example of 3D memory device 100 in FIGS. 1A and 1B and may have any suitable architectures that include a dummy staircase structure in a dummy staircase region. It is further understood that the on-chip capacitors disclosed herein, such as the capacitors in FIGS. 1A and 1B, can serve any suitable functions in a semiconductor device, such as decoupling capacitors (also known as bypass capacitors) for decoupling one part of a circuit from another (e.g., to bypass the power supply or other high impedance component of a circuit to keep the voltage stable), coupling capacitors for blocking the DC signal on the transmission line, filter capacitors in electronic filters, etc.

Figure 2:
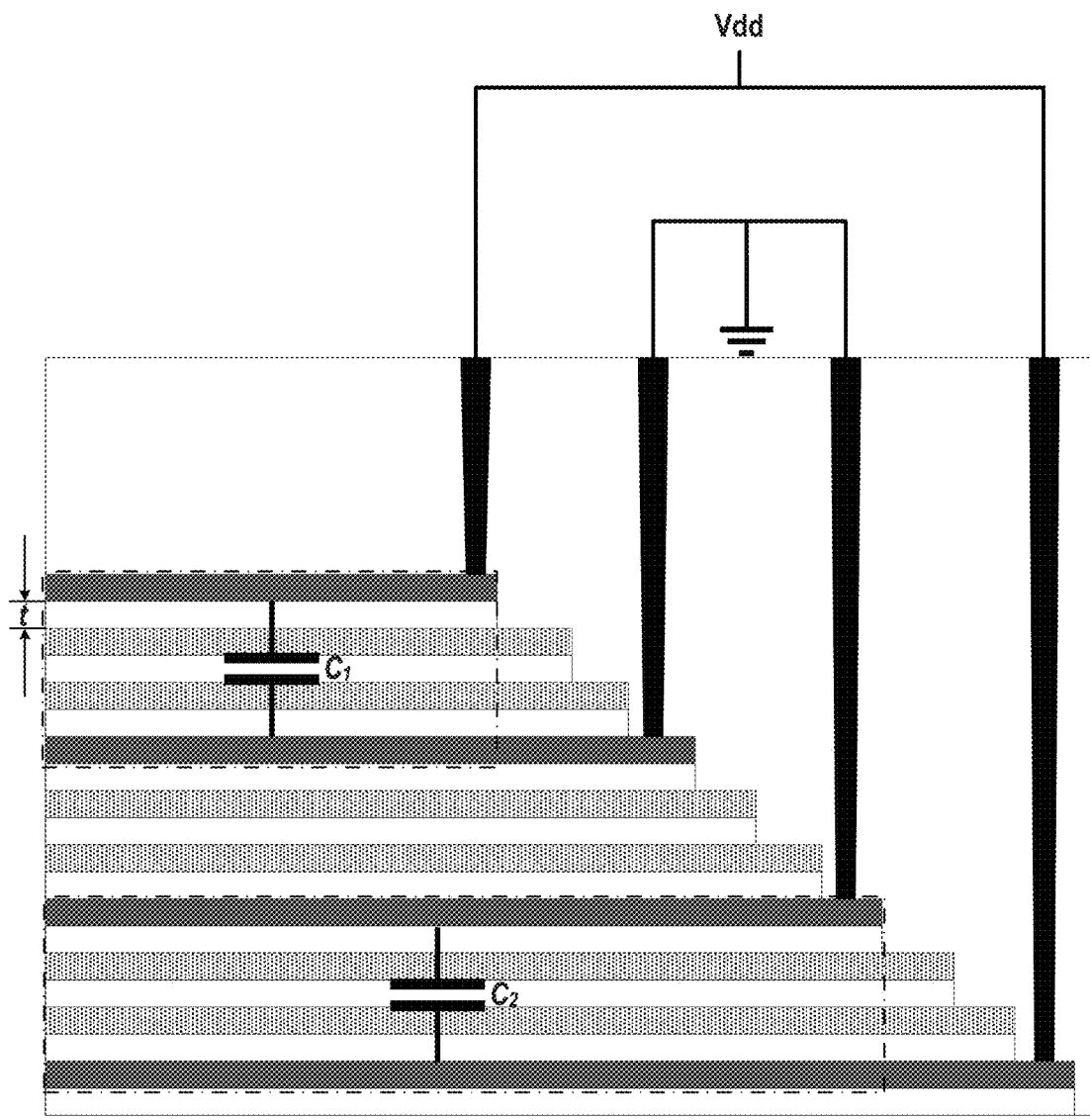
FIG. 2 illustrates a schematic diagram of exemplary on-chip capacitors in a 3D semiconductor device, according to some embodiments of the present disclosure.
Figure 2:
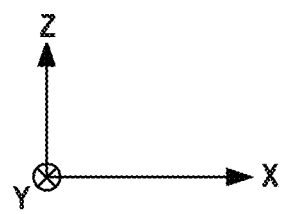

FIG. 2 illustrates a schematic diagram of exemplary on-chip capacitors in a 3D semiconductor device, according to some embodiments of the present disclosure. As shown in FIG. 2, the 3D semiconductor device, such as 3D memory device 100, can include a stack of a plurality of pairs of interleaved conductive layers and dielectric layers, such as conductive layers 106 and dielectric layers 108 in FIGS. 1A and 1B. The edges of the plurality of pairs of interleaved conductive layers and dielectric layers are staggered, such as in staircase structure 124 in dummy staircase region 112 in FIGS. 1A and 1B, according to some embodiments. In some embodiments, a pair of capacitor contacts, such as capacitor contacts 126 in FIGS. 1A and 1B, are in contact with two conductive layers of two pairs of the plurality of pairs of interleaved conductive layers and dielectric layers, respectively. The conductive layers can include a metal, such as W, and the dielectric layers can include silicon oxide.

In some embodiments as shown in FIG. 2, the 3D semiconductor device includes at least two on-chip capacitors $C_1$ and $C_2$ in parallel. Each capacitor $C_1$ or $C_2$ includes the corresponding two conductive layers (as the pair of capacitor electrodes) and one or more dielectric layers (as the capacitor dielectric) vertically between the two conductive layers, according to some embodiments. In some embodiments, the two conductive layers (as the pair of capacitor electrodes) are electrically separated from one another. In some embodiments, the two conductive layers are spaced apart by at least another pair of the plurality of pairs of interleaved conductive layers and dielectric layers, such that each capacitor $C_1$ or $C_2$ includes the two conductive layers (as the pair of capacitor electrodes) and a plurality of dielectric layers (as the pair of capacitor electrodes, e.g., three dielectric layers shown in FIG. 2) vertically between the two conductive layers.

Accordingly, the capacitance density of each capacitor $C_1$ or $C_2$ may be determined based on the material (i.e., dielectric constant) and the number of the dielectric layers between the respective pair of capacitor electrodes and the thickness "t" of each dielectric layer. In some embodiments, the material of the dielectric layer is silicon oxide, the number of the dielectric layers is 2 or 3, and the thickness of each dielectric layer is between 15 nm and 30 nm. The capacitance of each capacitor $C_1$ or $C_2$ may be determined based on the capacitance density as well as the capacitance area. In some embodiments, the capacitance area is determined based on the dimension of the shorter one (e.g., the upper) of the two conductive layers (as the pair of capacitor electrodes) in the dummy staircase region in the x-direction in FIG. 2 (e.g., the word line direction) as well as the dimension of the conductive layers (as the pair of capacitor electrodes) in the y-direction (e.g., the bit line direction) in FIGS. 3 and 4A. Since dummy staircase region 306 or 406 may be divided into multiple blocks 310 or 410 by slit structures 308 or 408, the dimension of the conductive layers in the y-direction for determining the capacitance area may be the dimension of each block 310 or 410, as shown in FIGS. 3 and 4A. In some embodiments, the capacitance area is determined based on the dimension of the shorter one (e.g., the upper) of the two conductive layers (as the pair of capacitor electrodes) in the dummy staircase region in the x-direction in FIG. 2 (e.g., the word line direction) as well as the dimension of the conductive layers (as the pair of capacitor electrodes) in the y-direction (e.g., the bit line direction) in FIG. 5. As shown in FIG. 5, the dimension of the conductive layers in the y-direction is the same as the dimension of dummy staircase region 506 in the y-direction. In some embodiments, capacitor $C_1$ or $C_2$ is a decoupling capacitor electrically connected to the power line and the ground of the 3D semiconductor device.

FIGS. 6A-6D illustrate fabrication processes for forming an exemplary 3D memory device having on-chip capacitors, according to various embodiments of the present disclosure. FIG. 7 illustrates a flowchart of an exemplary method 700 for forming a 3D memory device having on-chip capacitors, according to some embodiments of the present disclosure. Examples of the 3D memory device depicted in FIGS. 6A-6D and 7 include 3D memory device 100 depicted in FIGS. 1A and 1B. FIGS. 6A-6D and 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a memory stack including vertically interleaved conductive layers and first dielectric layers is formed above a substrate. The substrate can be a silicon substrate. In some embodiments, to form the memory stack, a dielectric stack including vertically interleaved second dielectric layers and the first dielectric layers is formed, a staircase structure is formed in a dummy staircase region, and at least parts of the second dielectric layers of the dielectric stack are replaced with the conductive layers of the memory stack. In some embodiments, a plurality of channel structures each extending vertically through the memory stack in a core array region are formed. The conductive layers can include a metal, the first dielectric layers can include silicon oxide, and the second dielectric layers can include silicon nitride.

Figure 6A:
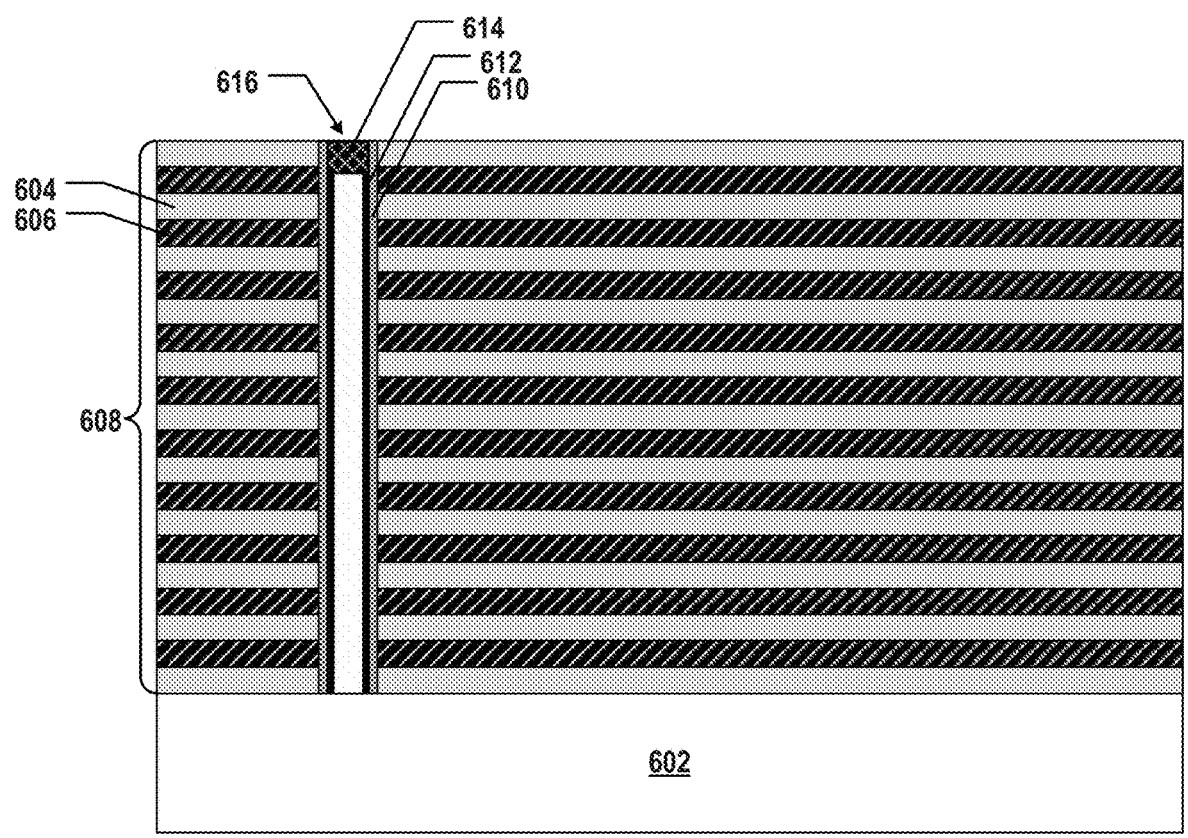
FIGS. 6A-6D illustrate fabrication processes for forming an exemplary 3D memory device having on-chip capacitors, according to various embodiments of the present disclosure.
Figure 7:
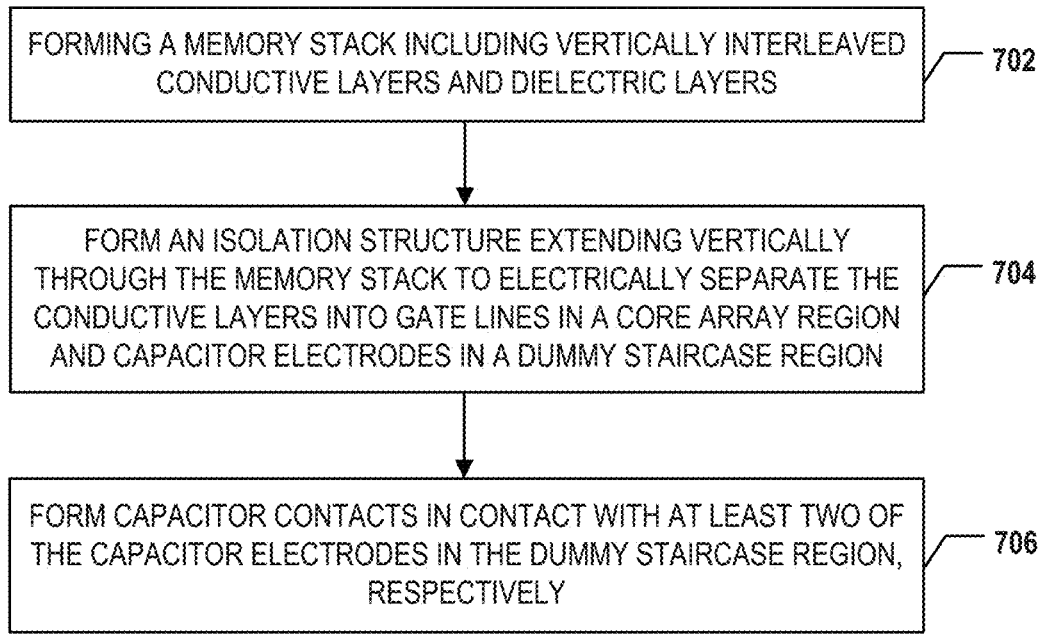
FIG. 7 illustrates a flowchart of an exemplary method for forming a 3D memory device having on-chip capacitors, according to some embodiments of the present disclosure.

As illustrated in FIG. 6A, a dielectric stack 608 including a plurality of interleaved first dielectric layers (dielectric layers 604) and second dielectric layers (sacrificial layers 606) is formed above a silicon substrate 602. In some embodiments, dielectric layers 604 and sacrificial layers 606 are alternatingly deposited by one or more thin film deposition processes including, but not limited to, physical vapor deposition (PVD), chemical vapor deposition (CVD), atomic layer deposition (ALD), or any combination thereof. In some embodiments, sacrificial layers 606 include silicon nitride, and dielectric layers 604 include silicon oxide. It is understood that the sequence of depositing sacrificial layers 606 and dielectric layers 604 is not limited. The deposition can start with sacrificial layer 606 or dielectric layer 604 and can end with sacrificial layer 606 or dielectric layer 604.

As illustrated in FIG. 6A, a channel structure 616 extending vertically through interleaved sacrificial layers 606 and dielectric layers 604 in dielectric stack 608 is formed. In some embodiments, fabrication processes to form channel structure 616 include forming a channel hole through interleaved sacrificial layers 606 and dielectric layers 604 in dielectric stack 608 using dry etching/and or wet etching, such as deep reactive-ion etching (DRIE), followed by filling the channel hole with a plurality of layers, such as a memory film 610 layer and a semiconductor channel 612, using thin film deposition processes. In some embodiments, memory film 610 is a composite dielectric layer, such as a combination of multiple dielectric layers including, but not limited to, a blocking layer, a storage layer, and a tunneling layer. Memory film 610 and semiconductor channel 612 can be formed by sequentially deposited a plurality of layers, such as a silicon oxide layer, a silicon nitride layer, a silicon oxide layer, and a polysilicon layer using one or more thin film deposition processes including, but not limited to ALD, CVD, PVD, or any combination thereof. The remaining space of the channel hole may be filled with a capping layer by depositing silicon oxide into the channel hole. In some embodiments, a channel plug 614 is formed in the top portion of the channel hole, for example, by etching back semiconductor channel 612 using dry etching and/or wet etching to form a recess and filling the recess with polysilicon using one or more thin film deposition processes including, but not limited to ALD, CVD, PVD, or any combination thereof.

Figure 6B:
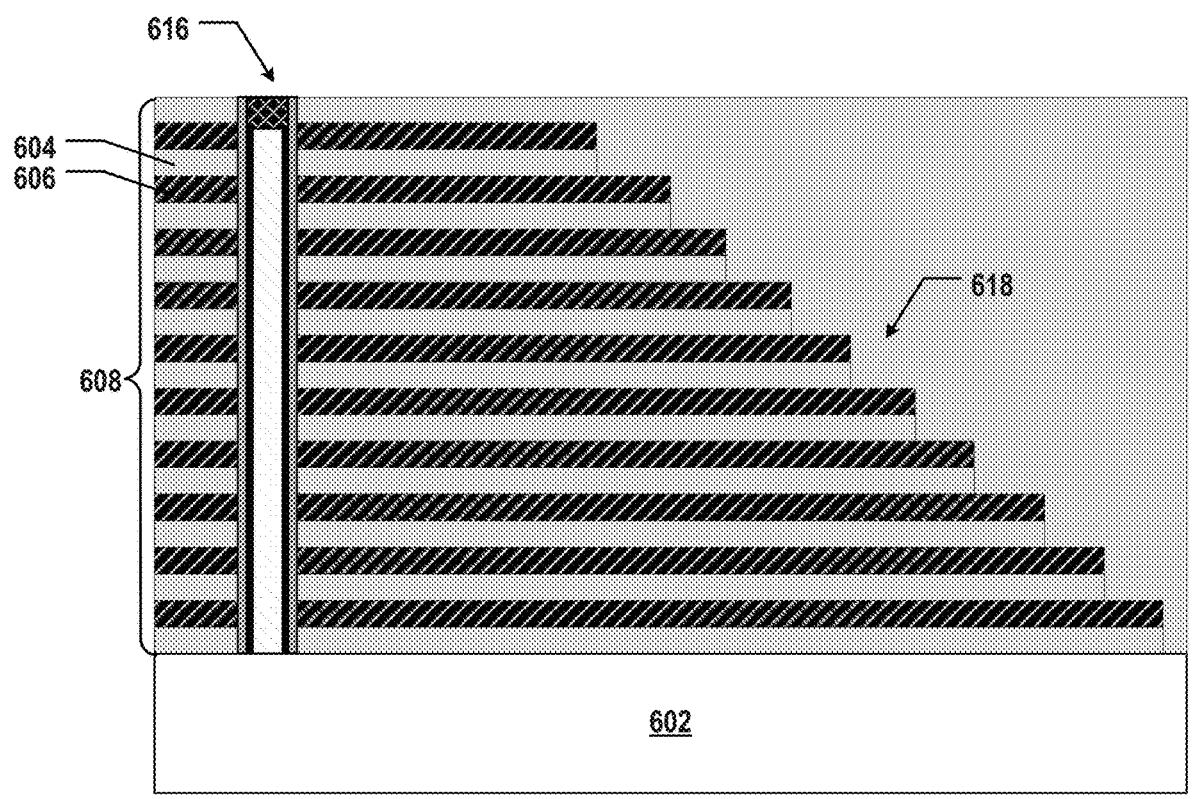

As illustrated in FIG. 6B, a staircase structure 618 is formed at at least one side of dielectric stack 608 (or in the intermediate of dielectric stack 608, not shown). Staircase structure 618 can be formed by the so-called "trim-etch" processes, which, in each cycle, trims (e.g., etching incrementally and inwardly, often from all directions) a patterned photoresist layer, followed by etching the exposed portions of the interleaved sacrificial layer 606 and dielectric layers 604 of dielectric stack 608 using the trimmed photoresist layer as an etch mask to form one step/level of staircase structure 618. The process can be repeated until all the steps/levels of staircase structure 618 are formed.

Figure 6C:
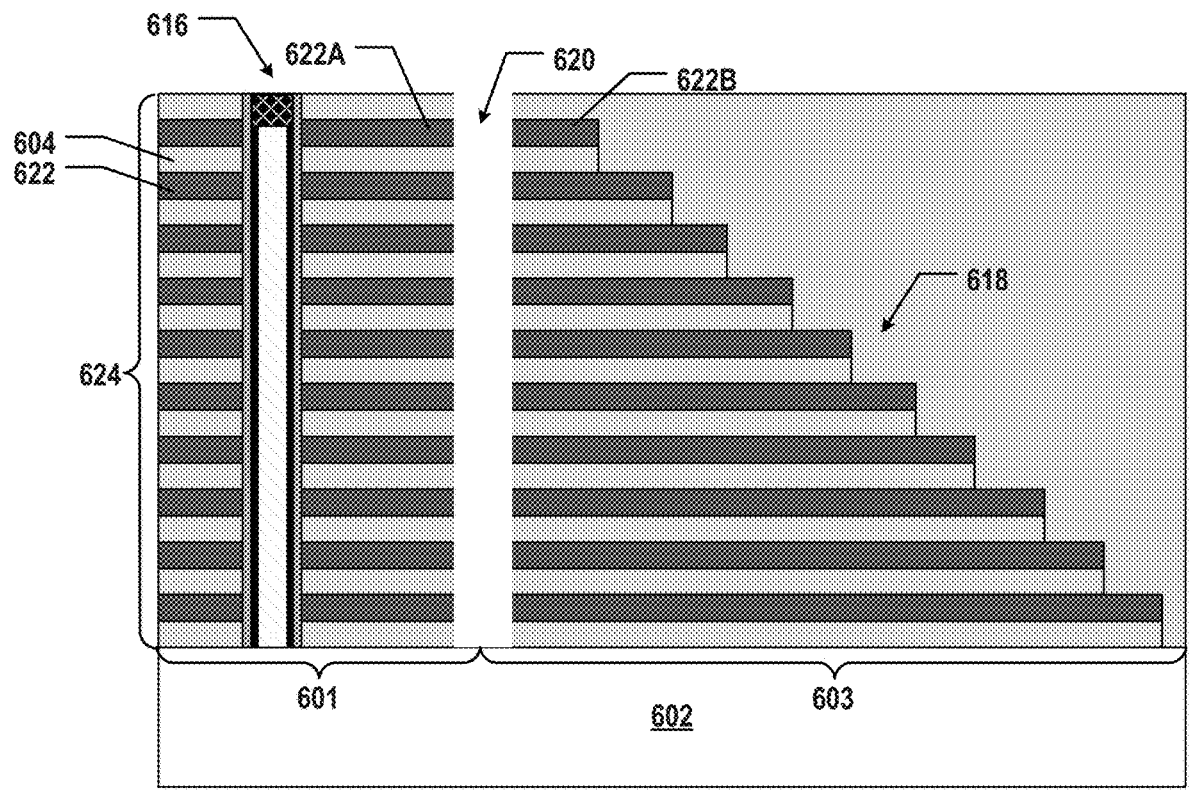

As illustrated in FIG. 6C, openings 620 (e.g., slits) are etched through dielectric stack 608 (shown in FIG. 6B). Openings 620 can be formed by wet etching and/or dry etching of dielectrics (e.g., silicon oxide and silicon nitride), such as DRIE. Openings 620 can be used as the passageways for gate replacement processes that replace sacrificial layers 606 (shown in FIG. 6B) in dielectric stack 608 with conductive layers 622 to form a plurality of interleaved conductive layers 622 and dielectric layers 604. The replacement of sacrificial layers 606 with conductive layers 622 can be performed by wet etching sacrificial layers 606 (e.g., silicon nitride) selective to dielectric layers 604 (e.g., silicon oxide) and filling the resulting lateral recesses with conductive layers 622 (e.g., W). Conductive layers 622 can be deposited by PVD, CVD, ALD, electrochemical depositions, or any combination thereof. Conductive layers 622 can include conductive materials including, but not limited to, W, Co, Cu, Al, polysilicon, silicides, or any combination thereof. As a result, after the gate replacement processes, dielectric stack 608 is replaced by memory stack 624 including interleaved conductive layers 622 and dielectric layers 604 above silicon substrate 602, according to some embodiments. Channel structure 616 is thereby formed extending vertically through memory stack 624, according to some embodiments. In some embodiments, memory stack 624 includes staircase structure 618 at at least one side thereof (or in the intermediate thereof, not shown).

Method 700 proceeds to operation 704, as illustrated in FIG. 7, in which an isolation structure extending vertically through the memory stack is formed to electrically separate the conductive layers into gate electrodes in the core array region and capacitor electrodes in the dummy staircase region. In some embodiments, in the same process for forming the isolation structure, a slit structure extending vertically through the memory stack and extending laterally and perpendicular to the isolation structure is formed. In some embodiments, to form the isolation structure, an opening extending laterally between the core array region and the dummy staircase region is formed, and a dielectric spacer is formed in the opening. In some embodiments, to form the isolation structure, parts of the second dielectric layers of the dielectric stack are replaced with the conductive layers of the memory stack to form the isolation structure including the remainder of the dielectric stack.

As illustrated in FIG. 6C, at least one of openings 620 is formed laterally between a core array region 601 in which channel structure 616 is formed and a dummy staircase region 603 in which staircase structure 618 is formed. Opening 620 can extend vertically through conductive layers 622 of memory stack 624 to electrically separate conductive layers 622 into gate electrodes 622A in core array region 601 and capacitor electrodes 622B in dummy staircase region 603.

Figure 6D:
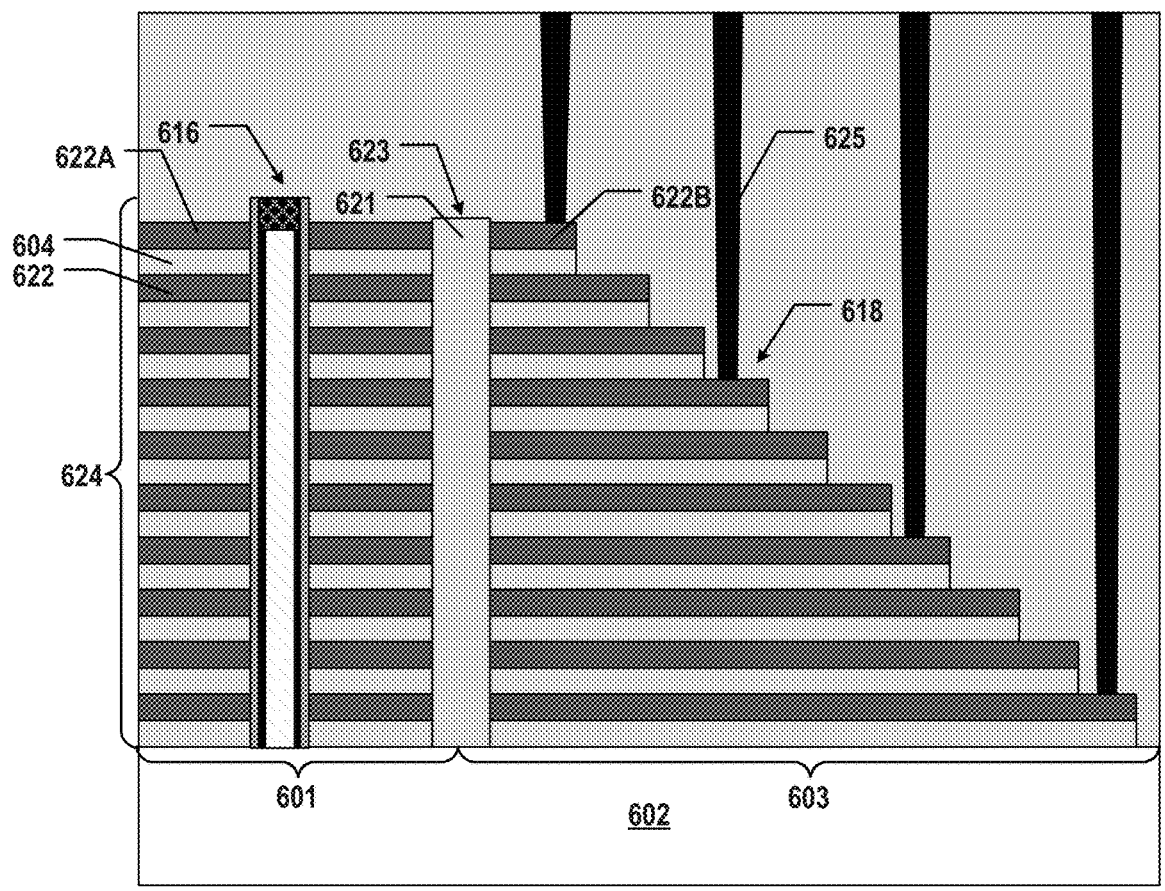

As illustrated in FIG. 6D, an isolation structure 623 is formed in opening 620 (shown in FIG. 6C) laterally between core array region 601 and dummy staircase region 603. In some embodiments, to form isolation structure 623, a dielectric spacer 621 is formed by depositing one or more dielectric materials, such as silicon oxide and/or high-k dielectrics, into opening 620 using one or more thin film deposition processes including, but not limited to ALD, CVD, PVD, or any combination thereof. Dielectric spacer 621 can fully fill opening 620, or partially fill opening 620, such that the remaining space of opening 620 can be filled with a conductor (not shown) surrounded by dielectric spacer 621. Nevertheless, as shown in FIG. 6D, isolation structure 623 including dielectric spacer 621 extends vertically through memory stack 624 to electrically separate conductive layers 622 into gate electrodes 622A in core array region 601 and capacitor electrodes 622B in dummy staircase region 603, according to some embodiments. In some embodiments, slit structures are formed using the same processes for forming isolation structure 623 by forming dielectric spacer 621 in other openings 620. Thus, the slit structures and isolation structure 623 can have the same structure and materials. That is, the formation of isolation structure 623 does not introduce additional processes and may use the existing processes for forming the slit structures. It is understood that in some examples, isolation structure 623 (and opening 620) may not extend vertically through the entire thickness of memory stack 624 to cut all conductive layers 622 into gate electrodes 622A and capacitor electrodes 622B, but instead, may extend vertically through part of memory stack 622 to cut one or some of conductive layers 622 into gate electrodes 622A and capacitor electrodes 622B.

Although not shown, it is understood that in some examples, an isolation structure (e.g., isolation structure 412 in FIGS. 4A and 4B) may be formed by replacing only parts of sacrificial layers 606 of dielectric stack 608 with conductive layers 622 of memory stack 624 during the gate-replacement process, such that the remainder of dielectric stack 608 may become the isolation structure. For example, the conditions of the etching process for removing sacrificial layers 606, e.g., the etching rate and/or etching time, may be controlled such that part of dielectric stack 608 laterally between core array region 601 and dummy staircase region 603 remains intact during the gate-replacement process.

Method 700 proceeds to operation 706, as illustrated in FIG. 7, in which a plurality of capacitor contacts in contact with at least two of the capacitor electrodes in the dummy staircase region, respectively, are formed. As illustrated in FIG. 6D, capacitor contacts 625 are formed above and in contact with at least some of capacitor electrodes 622B in dummy staircase region 603, respectively. Capacitor contacts 625 can be formed by etching contact holes in contact with respective capacitor contacts 625 using dry etching and/or wet etching, followed by depositing conductive materials, such as W, to fill the contact holes using one or more thin film deposition processes including, but not limited to ALD, CVD, PVD, or any combination thereof. In some embodiments, capacitor contacts 625 are formed using the same process for forming word line contacts (not shown) above and in contact with the word lines in the functional staircase region (not shown), such that capacitor contact 625 and word line contact may have the same structure and material. That is, the formation of capacitor contacts 625 does not introduce additional processes and may use the existing processes for forming the word line contacts.

Figure 8:
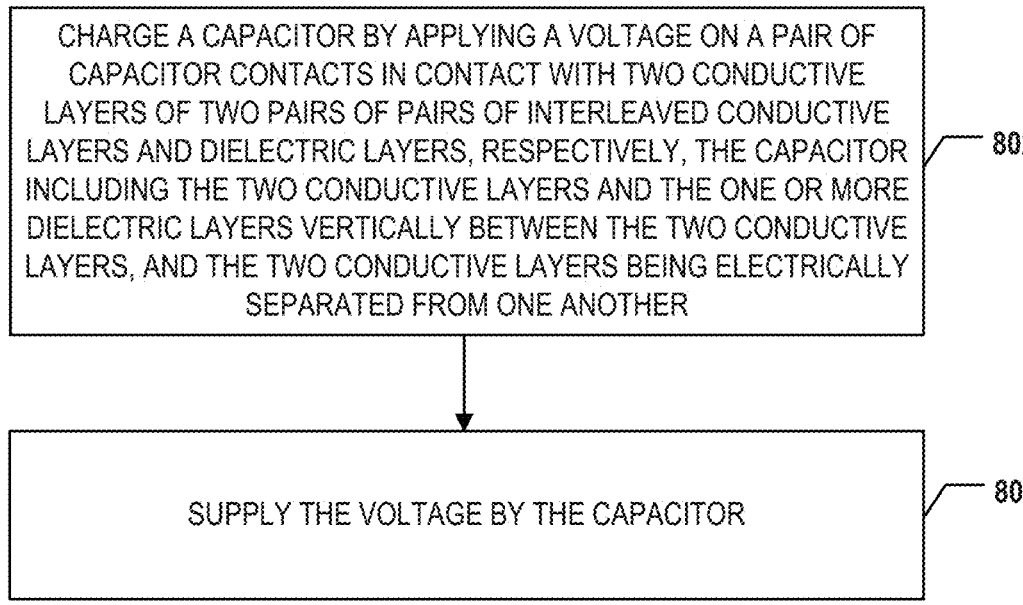
FIG. 8 illustrates a flowchart of an exemplary method for operating a 3D semiconductor device having on-chip capacitors, according to some embodiments of the present disclosure.

FIG. 8 illustrates a flowchart of a method 800 for operating an exemplary 3D semiconductor device having on-chip capacitors, according to some embodiments of the present disclosure. Examples of the 3D semiconductor device depicted in FIG. 8 include 3D memory device 100 depicted in FIGS. 1A and 1B. FIG. 8 will be described with reference to FIG. 2. It is understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operation 802, in which a capacitor in a 3D semiconductor device is charged. The 3D semiconductor device can include a stack of a plurality of pairs of interleaved conductive layers and dielectric layers ash shown in FIG. 2. The edges of the plurality of pairs of interleaved conductive layers and dielectric layers are staggered, for example, forming a dummy staircase structure in a dummy staircase region in FIG. 2. As illustrated in FIG. 2, two conductive layers of two pairs of the plurality of pairs of interleaved conductive layers and dielectric layers, respectively, and one or more dielectric layers vertically between the two conductive layers can be configured to form the capacitor $C_1$ or $C_2$, which can be charged by applying a voltage on a pair of capacitor contacts in contact with two corresponding conductive layers. The two conductive layers can be electrically separated from one another. In some embodiments, the capacitor $C_1$ or $C_2$ is electrically connected to a power line and a ground of the 3D semiconductor device.

Method 800 proceeds to operation 804, as illustration FIG. 8, in which the voltage is supplied by the capacitor. As illustrated in FIG. 3, electric charge can be stored in the capacitor $C_1$ or $C_2$. The capacitor $C_1$ or $C_2$ can work as a battery to simultaneously supply the voltage that charged the capacitor $C_1$ or $C_2$ to release the stored electric charge as needed.

According to one aspect of the present disclosure, a 3D memory device includes a memory stack, an isolation structure, and a plurality of capacitor contacts. The memory stack includes vertically interleaved conductive layers and first dielectric layers. The isolation structure extends vertically through at least part of the memory stack to electrically separate at least some of the conductive layers into gate electrodes in a core array region and capacitor electrodes in a dummy staircase region. The plurality of capacitor contacts are in contact with at least two of the capacitor electrodes in the dummy staircase region, respectively.

In some embodiments, the plurality of capacitor contacts include a first capacitor contact and a second capacitor contact in contact with a first capacitor electrode and a second capacitor electrode, respectively, and the first and second capacitor electrodes and the one or more dielectric layers vertically between the first and second capacitor electrodes in the dummy staircase region are configured to form a capacitor.

In some embodiments, the first and second capacitor electrodes are spaced apart by at least one another capacitor electrode vertically between the first and second capacitor electrodes. In some embodiments, the at least one another capacitor electrode includes two capacitor electrodes.

In some embodiments, the first and second capacitor electrodes are electrically separated from one another.

In some embodiments, a thickness of each of the first dielectric layers is between about 15 nm and about 30 nm.

In some embodiments, the isolation structure extends laterally between the core array region and the dummy staircase region of the memory stack.

In some embodiments, the isolation structure includes a dielectric spacer extending vertically through the memory stack.

In some embodiments, the isolation structure includes a dielectric stack including vertically interleaved second dielectric layers and the first dielectric layers.

In some embodiments, the 3D memory device further includes a slit structure extending vertically through the memory stack and extending laterally and perpendicular to the isolation structure to separate the dummy staircase region from a functional staircase region.

In some embodiments, the dummy staircase region and the functional staircase region are at a same side of the memory stack.

In some embodiments, the 3D memory device further includes a slit structure extending vertically through the memory stack and extending laterally and parallel to the isolation structure to extend across a functional staircase region.

In some embodiments, the functional staircase region is in an intermediate of the memory stack, and the dummy staircase region is at a side of the memory stack.

In some embodiments, the 3D memory device further includes a plurality of channel structures each extending vertically through the memory stack in the core array region.

In some embodiments, the conductive layers include a metal, and the first dielectric layers include silicon oxide.

According to another aspect of the present disclosure, a 3D semiconductor device includes a stack of a plurality of pairs of interleaved conductive layers and dielectric layers, a pair of capacitor contacts, and a capacitor. Edges of the plurality of pairs of interleaved conductive layers and dielectric layers are staggered. The pair of capacitor contacts are in contact with two conductive layers of two pairs of the plurality of pairs of interleaved conductive layers and dielectric layers, respectively. The capacitor includes the two conductive layers and one or more dielectric layers vertically between the two conductive layers. The two conductive layers are electrically separated from one another.

In some embodiments, the two conductive layers are spaced apart by at least another pair of the plurality of pairs of interleaved conductive layers and dielectric layers, such that the capacitor comprises the two conductive layers and a plurality of dielectric layers vertically between the two conductive layers.

In some embodiments, a thickness of each of the dielectric layers is between about 15 nm and about 30 nm.

In some embodiments, the conductive layers include a metal, and the dielectric layers include silicon oxide.

In some embodiments, the capacitor is electrically connected to a power line and a ground of the 3D semiconductor device.

According to still another aspect of the present disclosure, a method for forming a 3D memory device is disclosed. A memory stack including vertically interleaved conductive layers and first dielectric layers is formed above a substrate. An isolation structure extending vertically through at least part of the memory stack is formed to electrically separate at least some of the conductive layers into gate electrodes in a core array region and capacitor electrodes in a dummy staircase region. A plurality of capacitor contacts in contact with at least two of the capacitor electrodes in the dummy staircase region, respectively, are formed.

In some embodiments, a thickness of each of the first dielectric layers is between about 15 nm and about 30 nm.

In some embodiments, to form the memory stack, a dielectric stack including vertically interleaved second dielectric layers and the first dielectric layers is formed, a staircase structure in the dummy staircase region is formed, and at least parts of the second dielectric layers of the dielectric stack are replaced with the conductive layers of the memory stack.

In some embodiments, to form the isolation structure, parts of the second dielectric layers of the dielectric stack are replaced with the conductive layers of the memory stack to form the isolation structure including a remainder of the dielectric stack.

In some embodiments, a plurality of channel structures each extending vertically through the memory stack in the core array region are formed.

In some embodiments, the conductive layers include a metal, the first dielectric layers include silicon oxide, and the second dielectric layers include silicon nitride.

In some embodiments, to form the isolation structure, an opening extending laterally between the core array region and the dummy staircase region is formed, and a dielectric spacer is formed in the opening.

In some embodiments, in a same process for forming the isolation structure, a slit structure extending vertically through the memory stack and extending laterally and perpendicular to the isolation structure is formed.

According to yet another aspect of the present disclosure, a method for forming a 3D semiconductor device is disclosed. The 3D semiconductor device includes a stack of a plurality of pairs of interleaved conductive layers and dielectric layers. Edges of the plurality of pairs of interleaved conductive layers and dielectric layers are staggered. A capacitor is charged by applying a voltage on a pair of capacitor contacts in contact with two conductive layers of two pairs of the plurality of pairs of interleaved conductive layers and dielectric layers, respectively. The capacitor includes the two conductive layers and one or more dielectric layers vertically between the two conductive layers. The two conductive layers are electrically separated from one another. The voltage is supplied by the capacitor.

In some embodiments, the capacitor is electrically connected to a power line and a ground of the 3D semiconductor device.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory stack comprising vertically interleaved conductive layers and first dielectric layers;
   an isolation structure extending vertically through at least part of the memory stack, and being adjacent to and between a dummy staircase region where a plurality of capacitor contacts are arranged and a core array region where a plurality of channel structures are arranged to separate the dummy staircase region and the core array region and to electrically separate at least some of the conductive layers into gate electrodes in the core array region and capacitor electrodes in the dummy staircase region, the isolation structure comprising a dielectric stack that comprises vertically interleaved second dielectric layers and the first dielectric layers; and
   the plurality of capacitor contacts in contact with at least two of the capacitor electrodes in the dummy staircase region, respectively.

2. The 3D memory device of claim 1, wherein
   the plurality of capacitor contacts comprise a first capacitor contact and a second capacitor contact in contact with a first capacitor electrode and a second capacitor electrode, respectively; and
   the first and second capacitor electrodes and one or more of the first dielectric layers vertically between the first and second capacitor electrodes in the dummy staircase region are configured to form a capacitor.

3. The 3D memory device of claim 2, wherein the first and second capacitor electrodes are spaced apart by at least one another capacitor electrode vertically between the first and second capacitor electrodes.

4. The 3D memory device of claim 3, wherein the at least one another capacitor electrode comprises two capacitor electrodes.

5. The 3D memory device of claim 2, wherein the first and second capacitor electrodes are electrically separated from one another.

6. The 3D memory device of claim 1, wherein a thickness of each of the first dielectric layers is between about 15 nm and about 30 nm.

7. The 3D memory device of claim 1, wherein the isolation structure extends laterally between the core array region and the dummy staircase region of the memory stack.

8. The 3D memory device of claim 1, wherein the isolation structure comprises a dielectric spacer extending vertically through the memory stack.

9. The 3D memory device of claim 1, further comprising a slit structure extending vertically through the memory stack and extending laterally and perpendicular to the isolation structure to separate the dummy staircase region from a functional staircase region.

10. The 3D memory device of claim 9, wherein the dummy staircase region and the functional staircase region are at a same side of the memory stack.

11. The 3D memory device of claim 1, further comprising a slit structure extending vertically through the memory stack and extending laterally and parallel to the isolation structure to extend across a functional staircase region.

12. The 3D memory device of claim 11, wherein the functional staircase region is in an intermediate of the memory stack, and the dummy staircase region is at a side of the memory stack.

13. The 3D memory device of claim 1, further comprising the plurality of channel structures each extending vertically through the memory stack in the core array region.

14. The 3D memory device of claim 1, wherein the conductive layers comprise a metal, and the first dielectric layers comprise silicon oxide.

15. The 3D memory device of claim 1, wherein the first dielectric layers and the second dielectric layers comprise different dielectric materials.

16. A three-dimensional (3D) semiconductor device, comprising:
a stack of a plurality of pairs of interleaved conductive layers and first dielectric layers, wherein edges of the plurality of pairs of interleaved conductive layers and first dielectric layers are staggered;
a pair of capacitor contacts in contact with two conductive layers of two pairs of the plurality of pairs of interleaved conductive layers and first dielectric layers, respectively; and
a capacitor comprising the two conductive layers and one or more of the first dielectric layers vertically between the two conductive layers, the two conductive layers being electrically separated from one another, wherein:
the capacitor is arranged in a dummy staircase region; and
an isolation structure is adjacent to and arranged between the dummy staircase region and a core array region where a plurality of channel structures are arranged to separate the dummy staircase region and the core array region, the isolation structure comprising a dielectric stack that comprises vertically interleaved second dielectric layers and the first dielectric layers.

17. The 3D semiconductor device of claim 16, wherein the capacitor is electrically connected to a power line and a ground of the 3D semiconductor device.

18. A method for forming a three-dimensional (3D) memory device, comprising:
forming a memory stack comprising vertically interleaved conductive layers and first dielectric layers above a substrate;
forming an isolation structure extending vertically through at least part of the memory stack, and being adjacent to and between a dummy staircase region where a plurality of capacitor contacts are arranged and a core array region where a plurality of channel structures are arranged to separate the dummy staircase region and the core array region and to electrically separate at least some of the conductive layers into gate electrodes in the core array region and capacitor electrodes in the dummy staircase region, the isolation structure comprising a portion of a dielectric stack that comprises vertically interleaved second dielectric layers and the first dielectric layers; and
forming the plurality of capacitor contacts in contact with at least two of the capacitor electrodes in the dummy staircase region, respectively.

19. The method of claim 18, wherein forming the memory stack comprises:
forming the dielectric stack comprising vertically interleaved the second dielectric layers and the first dielectric layers;
forming a staircase structure in the dummy staircase region; and
replacing at least parts of the second dielectric layers of the dielectric stack with the conductive layers of the memory stack.

20. The method of claim 19, wherein forming the isolation structure comprises replacing parts of the second dielectric layers of the dielectric stack with the conductive layers of the memory stack to form the isolation structure comprising a remainder of the dielectric stack.

* * * * *